United States Patent
Sato

(10) Patent No.: US 8,936,507 B2
(45) Date of Patent: Jan. 20, 2015

(54) SEMICONDUCTOR MANUFACTURING APPARATUS

(75) Inventor: Fumiaki Sato, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 848 days.

(21) Appl. No.: 12/909,996

(22) Filed: Oct. 22, 2010

(65) Prior Publication Data

US 2011/0097981 A1     Apr. 28, 2011

Related U.S. Application Data

(60) Provisional application No. 61/265,538, filed on Dec. 1, 2009.

(30) Foreign Application Priority Data

Oct. 26, 2009     (JP) .................................. 2009-245575

(51) Int. Cl.
*F23J 11/00*     (2006.01)
*H01L 21/677*     (2006.01)

(52) U.S. Cl.
CPC ............................. *H01L 21/67766* (2013.01)
USPC .......................................... 454/49; 414/217

(58) Field of Classification Search
CPC ............................................... H01L 21/67766
USPC ................................. 414/217; 901/49; 454/49
See application file for complete search history.

(56) References Cited

U.S. PATENT DOCUMENTS

| | | | |
|---|---|---|---|
| 4,802,815 A * | 2/1989 | Funabashi et al. ............ 414/680 |
| 6,371,713 B1 * | 4/2002 | Nishimura et al. ...... 414/222.13 |
| 6,783,107 B2 * | 8/2004 | Chatufale ........................ 251/54 |
| 7,246,985 B2 * | 7/2007 | Ferrara .......................... 414/217 |
| 8,257,498 B2 * | 9/2012 | Yamawaku et al. ............ 118/719 |
| 2002/0175303 A1 * | 11/2002 | Chatufale ........................ 251/62 |
| 2005/0109130 A1 * | 5/2005 | Ohi et al. ...................... 73/865.6 |
| 2005/0184130 A1 * | 8/2005 | Yoneda et al. ................ 228/101 |
| 2006/0207098 A1 * | 9/2006 | Tamaoka ................... 29/898.02 |

(Continued)

FOREIGN PATENT DOCUMENTS

JP     S62-228394 A     10/1987
JP     01265519 A *     10/1989

(Continued)

*Primary Examiner* — Kang Hu
*Assistant Examiner* — Dana Tighe
(74) *Attorney, Agent, or Firm* — Pearne & Gordon LLP

(57) ABSTRACT

Provided is a semiconductor manufacturing apparatus including an atmospheric transfer device capable of suppressing corrosion of a part without having a corrosion resistant part and, also, capable of taking anti-corrosion measures in a cost effective way. The semiconductor manufacturing apparatus 100, installed in a clean room, includes an atmospheric transfer device 116; an atmospheric transfer chamber 108 for accommodating the atmospheric transfer device 116; a cover member 118 for separating a part of the atmospheric transfer device 116 from the atmospheric transfer chamber 108; and a gas exhaust unit 120 that adjusts a region 119 enclosed by the cover member 118 to have a lower pressure than that of the atmospheric transfer chamber 108. Here, the cover member 118 is made of a corrosion resistant material or an anti-corrosion treatment may be performed on the cover member.

6 Claims, 5 Drawing Sheets

(56) References Cited

U.S. PATENT DOCUMENTS

| | | | |
|---|---|---|---|
| 2006/0225299 A1* | 10/2006 | Kim et al. | 34/78 |
| 2008/0044259 A1* | 2/2008 | Kurita et al. | 414/220 |
| 2009/0028672 A1* | 1/2009 | Yamawaku et al. | 414/217 |
| 2012/0128450 A1* | 5/2012 | Caveney et al. | 414/217 |
| 2013/0032437 A1* | 2/2013 | Akin et al. | 188/106 F |

FOREIGN PATENT DOCUMENTS

| | | | |
|---|---|---|---|
| JP | 04-196532 A | | 7/1992 |
| JP | 2004-228576 A | | 8/2004 |
| JP | 2004330340 A | * | 11/2004 |
| JP | 2006-286682 A | | 10/2006 |
| JP | 2009-032877 A | | 2/2009 |

\* cited by examiner

LABYRINTH STRUCTURE

SEMICONDUCTOR MANUFACTURING APPARATUS

CROSS-REFERENCE TO RELATED APPLICATION

This application claims the benefit of Japanese Patent Application No. 2009-245575 filed on Oct. 26, 2009, and U.S. Provisional Application Ser. No. 61/265,538 filed on Dec. 1, 2009, the entire disclosures of which are incorporated herein by reference.

FIELD OF THE INVENTION

The present disclosure relates to a semiconductor manufacturing apparatus.

BACKGROUND OF THE INVENTION

In a manufacturing process of a semiconductor device, various processes such as a film forming process or an etching process are performed on a semiconductor wafer as a processing target substrate, and a semiconductor manufacturing apparatus has been used to perform such processes. The semiconductor manufacturing apparatus includes a processing unit for performing a process on a wafer; a mounting unit for mounting thereon a cassette container such as a FOUP (Front Opening Unified Pod) for accommodating therein a multiple number of wafers; and an atmospheric transfer chamber equipped with an atmospheric transfer device for transferring the wafers between the FOUP mounted on the mounting unit and the processing unit (see, for example, Patent Document 1).

When a processed wafer is transferred back into the atmospheric transfer chamber from the processing unit, components of a processing gas may remain on the processed wafer. In such a case, the gas components adhered to the wafer may be released within the atmospheric transfer chamber. If the released gas components are corrosive gas components, the atmospheric transfer device may be exposed to the corrosive gas components.

If the atmospheric transfer device is exposed to the corrosive gas components, the corrosive gas components would corrode the atmospheric transfer device.

Conventionally, in order to suppress the corrosion of the atmospheric transfer device, a corrosion resistant member has been used for a driving part of the atmospheric transfer device or each member of the atmospheric transfer device has been coated with a corrosion resistant material.

Patent Document 1: Japanese Patent Laid-open Publication No. 2006-286682

However, the corrosion resistant member is of a high price, and it takes high cost to coat each of a multiple number of members with a corrosion resistant material. Furthermore, a special part such as a sensor may not have a corrosion resistant part.

BRIEF SUMMARY OF THE INVENTION

In view of the foregoing, the present disclosure provides a semiconductor manufacturing apparatus including an atmospheric transfer device capable of suppressing corrosion of a part without having a corrosion resistant part and, also, capable of taking anti-corrosion measures in a cost effective way.

In accordance with one aspect of the present disclosure, there is provided a semiconductor manufacturing apparatus installed in a clean room. The semiconductor manufacturing apparatus includes an atmospheric transfer device; an atmospheric transfer chamber for accommodating the atmospheric transfer device; a cover member for separating a part of the atmospheric transfer device from the atmospheric transfer chamber; and a gas exhaust unit that adjusts a region enclosed by the cover member to have a lower pressure than that of the atmospheric transfer chamber. Here, the cover member may be made of a corrosion resistant material or an anti-corrosion treatment may be performed on the cover member.

In accordance with the present disclosure, it is possible to provide a semiconductor manufacturing apparatus including an atmospheric transfer device capable of suppressing corrosion of a part without having a corrosion resistant part and, also, capable of taking anti-corrosion measures in a cost effective way.

BRIEF DESCRIPTION OF THE DRAWINGS

Non-limiting and non-exhaustive embodiments will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION OF THE INVENTION

Figure 1:
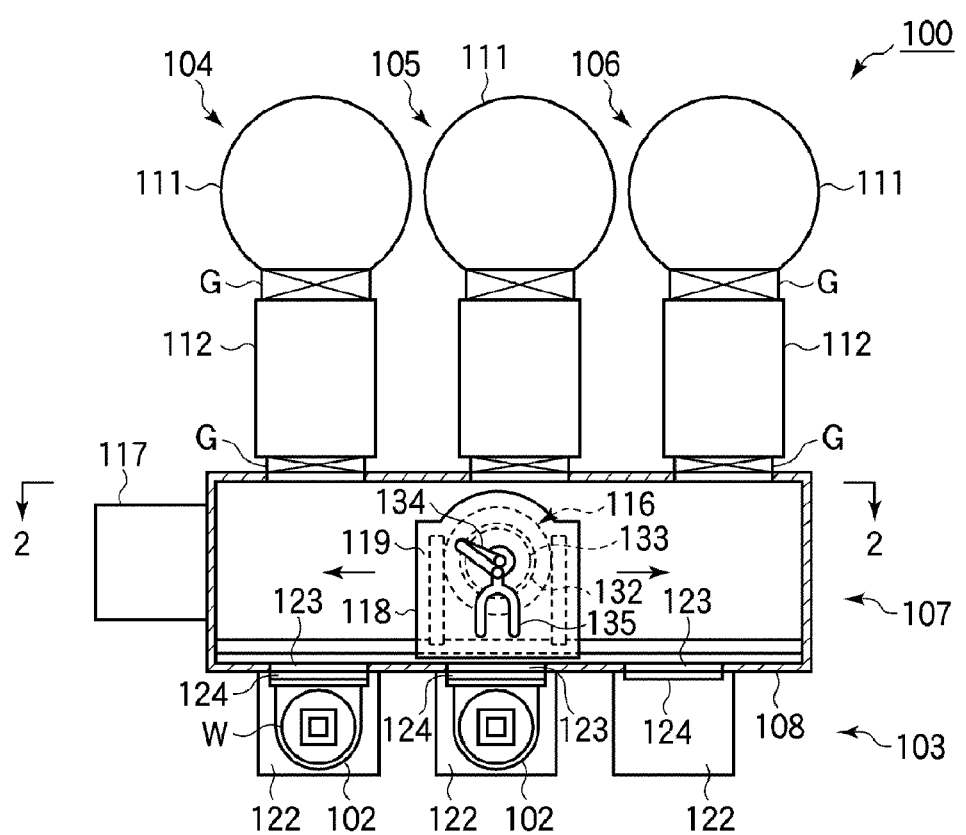
FIG. 1 is a plane view schematically illustrating an example semiconductor manufacturing apparatus including an atmospheric transfer device in accordance with an embodiment of the present disclosure.

Hereinafter, illustrative embodiments of the present disclosure will be described with reference to the accompanying drawings. Through the whole document, same parts will be assigned same reference numerals.

Figure 2:
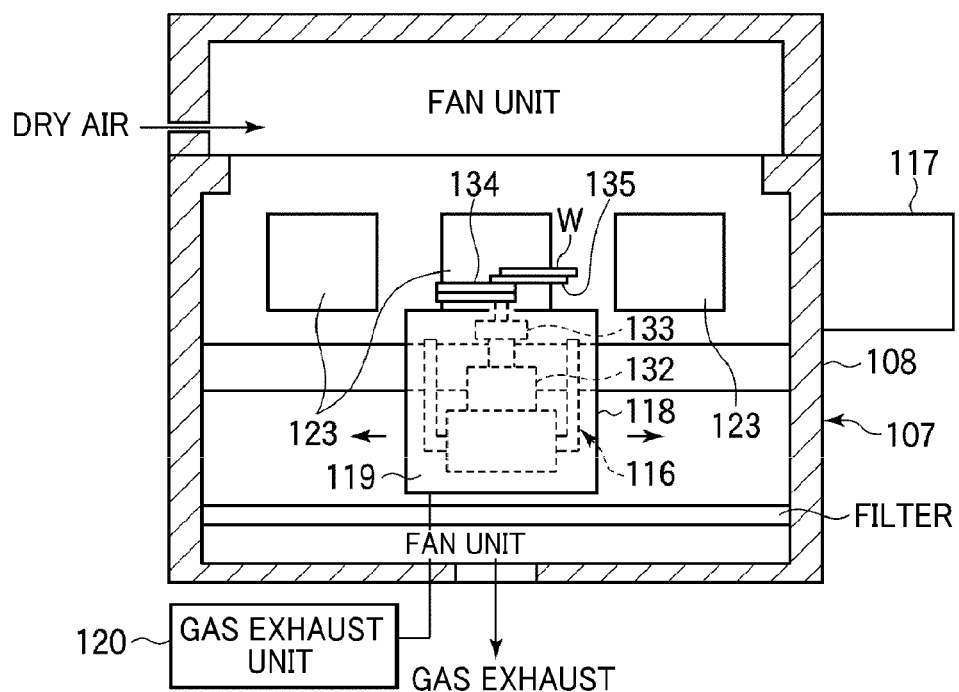
FIG. 2 is a cross sectional view taken along a line 2-2 of FIG. 1.

FIG. 1 is a plane view schematically illustrating an example semiconductor manufacturing apparatus including an atmospheric transfer device in accordance with an embodiment of the present disclosure. FIG. 2 is a cross sectional view taken along a line 2-2 of FIG. 1.

As depicted in FIGS. 1 and 2, a semiconductor manufacturing apparatus 100 may be a single-wafer etching apparatus that transfers semiconductor wafers (hereinafter, simply referred to as wafers) W as processing target substrates one by one and performs an etching process on each semiconductor wafer.

The semiconductor manufacturing apparatus 100 is installed in a clean room under a clean atmosphere. The semiconductor manufacturing apparatus 100 may include a mounting unit 103 for mounting thereon cassettes, e.g., FOUPs 102, each serving as a transport container for accommodating a plurality of, e.g., 25 sheets of wafers W; three processing units 104, 105 and 106 for performing a process such as an etching process on the wafers W; and an atmospheric transfer module 107 for transferring unprocessed wafers W from the FOUPs 102 into the processing units 104, 105 and 106 and also transferring processed wafers W from the processing units 104, 105 and 106 back into the FOUPs 102.

Each of the processing units 104 to 106 may include processing chambers 111 for performing a process such as an etching process on the wafer W; and load lock chambers 112, each including a transfer arm (not shown) for transferring the wafer W into one of the processing chambers 111. The inside of the load lock chamber 112 may be switched between a vacuum atmosphere and an atmospheric atmosphere. Each processing chamber 111 may have a cylindrical processing vessel. In such a processing chamber, a processing gas containing a halogen element such as $C_xF_y$, HBr or $Cl_2$ may be introduced into the processing vessel and plasma of the processing gas may be generated, and, thus, plasma etching may be performed on a film of the wafer W. Alternatively, a corrosive gas (e.g., $NH_3$) and HF may be introduced into the processing vessel, and isotropic etching may be performed on the wafer W.

In each of the processing units 104 to 106, the inside of each processing chamber 111 is maintained under a vacuum atmosphere, and the inside of each load lock chamber 112 can be switched between a vacuum atmosphere of substantially the same pressure as that of the processing chamber 111 and an atmospheric atmosphere of the same pressure as that of the atmospheric transfer module 107. The wafer W can be transferred between the load lock chamber 112 and the processing chamber 111 under the vacuum atmosphere by the transfer arm of the load lock chamber 112. Opening/closing gate valves G are installed between the transfer module 107 and the load lock chambers 112 and between the load lock chambers 112 and the processing chambers 111.

The atmospheric transfer module 107 may include an atmospheric transfer chamber 108 elongated in an arrangement direction (X direction) of the FOUPs 102, and an atmospheric transfer device 116 is installed within the atmospheric transfer chamber 108. The inside of the atmospheric transfer chamber 108 may serve as a mini-environment.

Further, an orienter 117 for aligning a direction of the wafer W loaded into the atmospheric transfer module 107 from the FOUP 102 is connected to a lateral side of the atmospheric transfer chamber 108.

The mounting unit 103 may include three FOUP platforms 122 installed in an X direction along a sidewall of the atmospheric transfer chamber 108 opposite to a sidewall where the processing units 104 to 106 are positioned. The atmospheric transfer chamber 108 is provided with three windows 123 at positions corresponding to three FOUP platforms 122, and each loading/unloading door (opener) 124 is installed at each window 123. When the FOUP 102 is mounted on the FOUP platform 122 and hermetically sealed against the atmospheric transfer chamber 108, the opener 124 is opened, and loading and unloading of the wafer W can be carried out.

The atmospheric transfer device 116 may include a Z-direction moving member 132 configured to be movable in a vertical direction (Z direction) within the atmospheric transfer chamber 108; a pivot table 133 provided on the Z-direction moving member 132; and a multi-joint transfer arm 134 installed on the pivot table 133. The transfer arm 134 may have a pick 135 for holding the wafer W at its leading end. Further, installed around the atmospheric transfer device 116 is a cover member 118 that encloses and separates a part of the atmospheric transfer device 116 such as the pivot table 133 and parts below the pivot table 133 in the present example, from the atmospheric transfer chamber 108. The cover member 118 may be made of a corrosion resistant material, or an anti-corrosion treatment may be performed on the cover member 118.

Further, in the present example, a gas exhaust unit 120 for evacuating a region 119 enclosed by the cover member 118 may be installed, and this gas exhaust unit 120 may serve as a gas exhaust mechanism.

Moreover, in the present example, an internal pressure A of the atmospheric transfer chamber 108 may be set to be higher than an internal pressure B of the clean room (A>B), and an internal pressure C of the atmospheric transfer device 116 may be set to be higher than an internal pressure D of the region 119 enclosed by the cover member 118 (C>D).

Here, the internal pressure A of the atmospheric transfer chamber 108 is set to be higher than the internal pressure B of the clean room (A>B) in order to suppress entrance of particles into the atmospheric transfer chamber 108 from the clean room.

Further, the internal pressure C of the atmospheric transfer device 116 is set to be higher than the internal pressure D of the region 119 enclosed by the cover member 118 (C>D) in order to suppress corrosive gas components in the region 119 from flowing into the inside of the atmospheric transfer device 116. That is, even if corrosive gas components are released from the wafer W transferred back into the atmospheric transfer chamber 108 from one of the processing units 104 to 106, the corrosive gas components may not flow into the inside of the atmospheric transfer device 116 via the region 119 by setting a pressure relationship to "C>D."

Desirably, a pressure relationship between the internal pressure A of the atmospheric transfer chamber 108, the internal pressure B of the clean room, the internal pressure C of the atmospheric transfer device 116 and the internal pressure D of the region 119 enclosed by the cover member 118 may be set to be A>B≥C>D.

If the pressure relationship of "A>B≥C>D" is set up, the following advantages may be achieved.

(1) By setting the internal pressure D of the region 119 to be lowest, particles generated as a result of moving the atmospheric transfer device 116 can be suppressed from being introduced into the atmospheric transfer chamber 108 via the region 119.

(2) In order to prevent the corrosive gas components from flowing into the atmospheric transfer device 16, the internal pressure D of the region 119 may be set to have a higher value than that of the internal pressure A of the atmospheric transfer chamber 108. In such a case, however, a great amount of dry air needs to be supplied. On the contrary, since the internal pressure D of the region 119 is set to be lowest, an amount of dry air supplied into the atmospheric transfer chamber 108 need not be increased, as compared to the case of setting the internal pressure D of the region 119 to be higher than the internal pressure A of the atmospheric transfer chamber 108.

As described above, in accordance with the atmospheric transfer device 116 of the illustrative embodiment, a part of the atmospheric transfer device 116 is enclosed by the cover member 118 and, thus, the part of the atmospheric transfer device 116 can be separated from the atmospheric transfer chamber 108.

With the above-described configuration, corrosion of the atmospheric transfer device 116 can be suppressed even if a corrosive gas is released from a processed wafer W in the region separated from the atmospheric transfer chamber 108 by the cover member 118.

As a result, corrosion of the atmospheric transfer device 116 can be suppressed without using a corrosion resistant member for each unit within the atmospheric transfer device 116 or without coating each unit with a corrosion resistant material. Thus, anti-corrosion measures can be taken in a cost effective way.

Further, corrosion of a part such as a sensor without having an anti-corrosive part can also be suppressed by installing such a part within the atmospheric transfer device 116.

Moreover, even if a corrosive gas is released from the processed wafer W, the corrosive gas can be suppressed from flowing into the atmospheric transfer device 116 via the region 119 by setting the internal pressure D of the region 119 enclosed by the cover member 118 to be lower than the internal pressure C of the atmospheric transfer device 116. Thus, the above-mentioned advantages can be more enhanced.

Furthermore, by setting the internal pressure D of the region 119 enclosed by the cover member 118 to be lower than the internal pressure A of the atmospheric transfer chamber 108 or to be lower than the internal pressure C of the atmospheric transfer device 116, particles generated as a result of driving the atmospheric transfer device 116 can be prevented from being introduced into the atmospheric transfer chamber 108 via the region 119. In addition, an amount of dry air supplied into the atmospheric transfer chamber 108 need not be increased, as compared to a case of setting the internal pressure D of the region 119 to be higher than the internal pressure A of the atmospheric transfer chamber 108.

In accordance with the present embodiment as described above, it is possible to provide the semiconductor manufacturing apparatus including the atmospheric transfer device capable of suppressing corrosion of a part without having a corrosion resistant part and, also, capable of taking anti-corrosion measures in a cost effective way.

Figure 3:
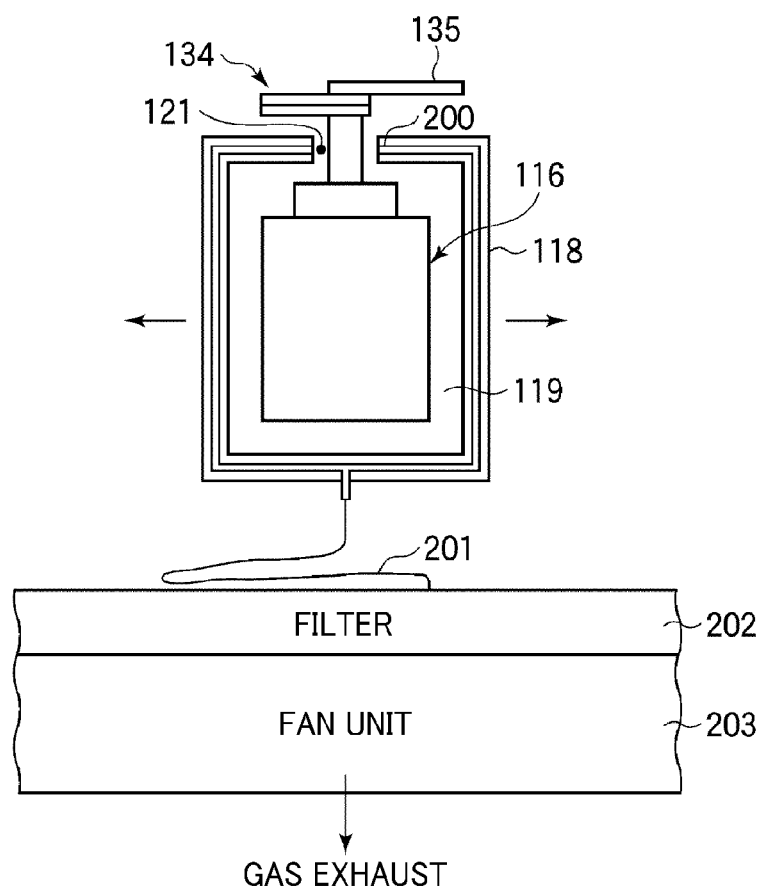
FIG. 3 illustrates a modification example of the atmospheric transfer device in accordance with the embodiment of the present disclosure.

FIG. 3 illustrates a modification example of the atmospheric transfer device 116 in accordance with the embodiment of the present disclosure.

As depicted in FIG. 3, in the atmospheric transfer device 116 in accordance with the above-described embodiment, a minute space 121 may be provided between the cover member 118 and the atmospheric transfer device 116 to prevent collision between a driving part of the atmospheric transfer device 116 and the cover member 118.

Figure 4:
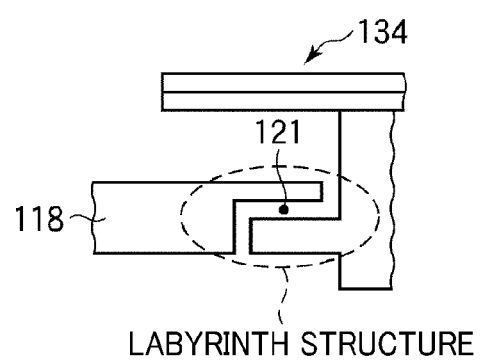
FIG. 4 illustrates a modification example of a minute space.

Moreover, by designing the minute space 121 to be smaller, desirably, to have a labyrinth structure as illustrated in FIG. 4, a sufficient pressure difference can be generated between the region 119 and the atmospheric transfer chamber 108 even if an exhaust amount of the gas exhaust unit 120 is small. Thus, inflow of the corrosive gas into the atmospheric transfer device 116 can be more effectively suppressed.

Further, in the modification example, a gas inlet 200 may be provided at a cover member 118's portion in contact with the minute space 121. The gas inlet 200 may be connected with, e.g., a flexible suction pipe 201, and the flexible suction pipe 201 may be connected with a filter 202 provided in a bottom portion of the atmospheric transfer chamber 108. A fan unit 203 may be installed below the filter 202, and a corrosive gas sucked in by the flexible suction pipe 201 may be exhausted by the fan unit 203 into, e.g., an acid evacuation system installed outside the atmospheric transfer chamber 108.

Figure 5:
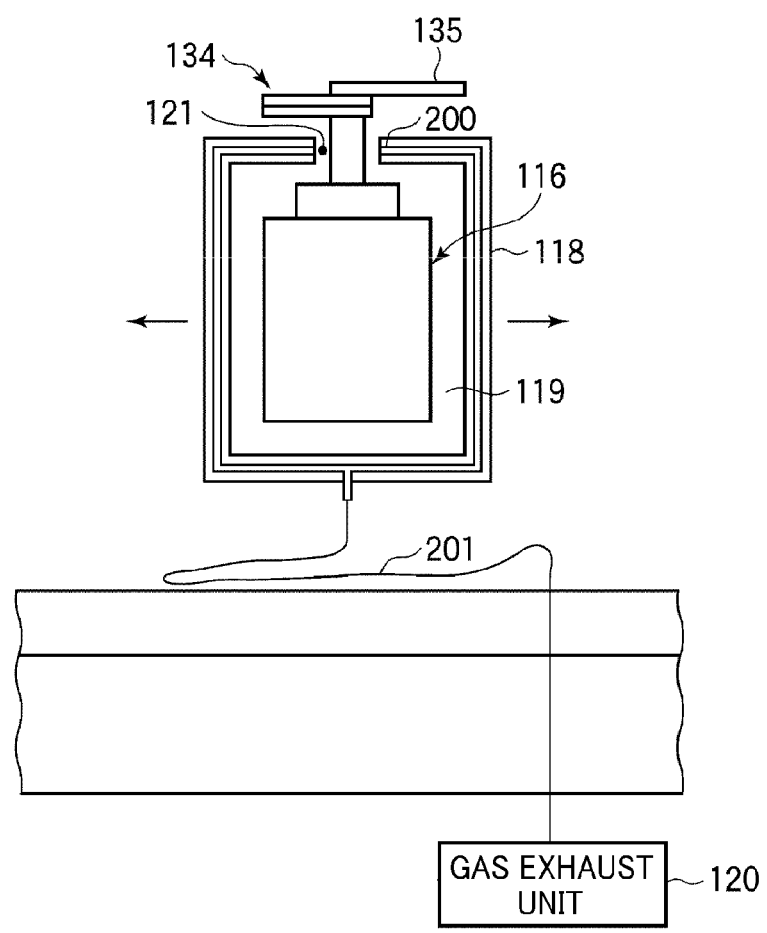
FIG. 5 illustrates another modification example of the atmospheric transfer device in accordance with the embodiment of the present disclosure.

Further, as depicted in FIG. 5, the flexible suction pipe 201 may be connected with the exhaust unit 120.

As stated above, just by providing the gas inlet 200 at the minute space 121 and evacuating the minute space 121, inflow of the corrosive gas into the atmospheric transfer device 116 can be more effectively suppressed.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

By way of example, although the above-mentioned embodiment has been described for the case of applying the present disclosure to the atmospheric transfer device installed in the atmospheric transfer chamber of the semiconductor manufacturing apparatus, the present disclosure is also applicable to a transfer device of an apparatus other than the semiconductor manufacturing apparatus as long as the transfer device is provided in a chamber into which a corrosive gas may be flown. In the embodiment, various changes and modifications may be made without departing from the scope of the invention.

What is claimed is:

1. A semiconductor manufacturing apparatus installed in a clean room, the apparatus comprising:
   an atmospheric transfer device;
   an atmospheric transfer chamber for accommodating the atmospheric transfer device;
   a cover member for separating a part of the atmospheric transfer device from the atmospheric transfer chamber; and
   a gas exhaust unit that adjusts a region enclosed by the cover member to have a lower pressure than that of the atmospheric transfer chamber,
   wherein the cover member is made of a corrosion resistant material or an anti-corrosion treatment is performed on the cover member,
   the atmospheric transfer device includes a pick for holding a substrate, and
   the cover member is configured to enclose only the part of the atmospheric transfer device, which is positioned below the pick, without enclosing the pick, and configured to separate the pick from the part of the atmospheric transfer device, such that the part of the atmospheric transfer device is suppressed from being corroded by a corrosive gas released from the substrate,
   a space is provided between the cover member and the atmospheric transfer device, the space having a labyrinth structure sufficient to maintain a pressure difference between the region enclosed by the cover member and the atmospheric transfer chamber,
   the atmospheric transfer device partly enclosed by the cover member is movable in a horizontal direction within the atmospheric transfer chamber, and
   the gas exhaust unit is vertically connected to a bottom of the cover member,
   wherein an upper portion of the cover member has a first protrusion which is protruded from a side surface of the upper portion toward said space,
   the atmospheric transfer device has a second protrusion which is protruded toward said space, and
   the first protrusion and the second protrusion form a flow path through the labyrinth structure extending in a horizontal direction.

2. The semiconductor manufacturing apparatus of claim 1, wherein an internal pressure A of the atmospheric transfer chamber is set to be higher than an internal pressure B of the clean room (A>B), and
   an internal pressure C of the atmospheric transfer device is set to be higher than an internal pressure D of the region enclosed by the cover member (C>D)

3. The semiconductor manufacturing apparatus of claim 2, wherein a gas inlet is provided at said space.

4. The semiconductor manufacturing apparatus of claim 1, wherein an internal pressure A of the atmospheric transfer chamber, an internal pressure B of the clean room, an internal pressure C of the atmospheric transfer device and an internal pressure D of the region enclosed by the cover member is set to be $A > B \geq C > D$.

5. The semiconductor manufacturing apparatus of claim 4, wherein a gas inlet is provided at said space.

6. The semiconductor manufacturing apparatus of claim 1, wherein a gas inlet is provided at said space.

* * * * *

UNITED STATES PATENT AND TRADEMARK OFFICE
CERTIFICATE OF CORRECTION

| | |
|---|---|
| PATENT NO. | : 8,936,507 B2 |
| APPLICATION NO. | : 12/909996 |
| DATED | : January 20, 2015 |
| INVENTOR(S) | : Fumiaki Sato |

Page 1 of 1

It is certified that error appears in the above-identified patent and that said Letters Patent is hereby corrected as shown below:

In the Claims,

Column 6, claim 2, line 65 please add -- . -- after "(C>D)"

Signed and Sealed this
Thirtieth Day of June, 2015

Michelle K. Lee
*Director of the United States Patent and Trademark Office*